United States Patent
Okazaki et al.

(10) Patent No.: US 7,599,210 B2
(45) Date of Patent: Oct. 6, 2009

(54) NONVOLATILE MEMORY CELL, STORAGE DEVICE AND NONVOLATILE LOGIC CIRCUIT

(75) Inventors: Nobumichi Okazaki, Kanagawa (JP);
Tsunenori Shiimoto, Kanagawa (JP);
Hidenari Hachino, Nagasaki (JP);
Wataru Otsuka, Tokyo (JP)

(73) Assignee: Sony Corporation, Tokyo (JP)

( * ) Notice: Subject to any disclaimer, the term of this patent is extended or adjusted under 35 U.S.C. 154(b) by 266 days.

(21) Appl. No.: 11/501,697

(22) Filed: Aug. 10, 2006

(65) Prior Publication Data

US 2007/0041242 A1 Feb. 22, 2007

(30) Foreign Application Priority Data

Aug. 19, 2005 (JP) ............................. 2005-238609
Aug. 26, 2005 (JP) ............................. 2005-245997

(51) Int. Cl.
*G11C 11/00* (2006.01)

(52) U.S. Cl. .................. 365/148; 365/154; 365/163; 365/158; 365/171

(58) Field of Classification Search ........... 365/185.07, 365/185.08, 148, 158, 163, 154, 226, 171
See application file for complete search history.

(56) References Cited

U.S. PATENT DOCUMENTS

| 5,159,571 | A | * | 10/1992 | Ito et al. ................... 365/201 |
| 5,355,331 | A | * | 10/1994 | Takase et al. ............... 365/154 |
| 7,436,694 | B2 | * | 10/2008 | Berthold et al. ............. 365/148 |
| 2005/0128791 | A1 | * | 6/2005 | Kang ....................... 365/154 |
| 2005/0162896 | A1 | * | 7/2005 | Jung ....................... 365/154 |
| 2005/0190597 | A1 | * | 9/2005 | Kato ..................... 365/185.08 |
| 2005/0195664 | A1 | * | 9/2005 | Ooishi ...................... 365/194 |

FOREIGN PATENT DOCUMENTS

JP 2003-233990 A 8/2003

* cited by examiner

*Primary Examiner*—Vu A Le
*Assistant Examiner*—Han Yang
(74) *Attorney, Agent, or Firm*—Rader, Fishman & Grauer PLLC; Christopher M. Tobin

(57) ABSTRACT

One or serially connected field effect transistors are cross coupled with each other, first terminals of nonvolatile variable resistance elements are connected to their storage nodes, and the other terminals of the variable resistance elements are connected to a power supply line to thereby form a memory cell. By controlling the voltage supplied to this power supply line, data of the memory cell immediately before turning off the power is stored in it when the power is turned off.

20 Claims, 10 Drawing Sheets

FIG. 4
CHARACTERISTIC DIAGRAM
OF ARAM ELEMENT
FIG. 4A
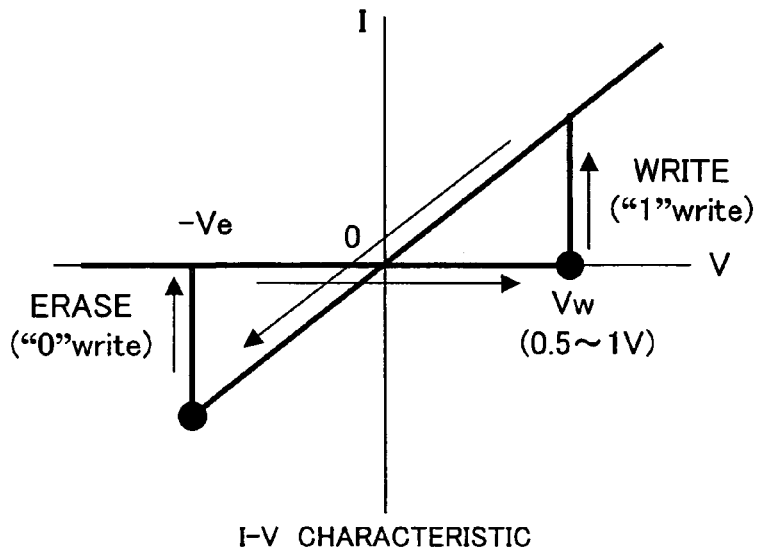
I-V CHARACTERISTIC
FIG. 4B
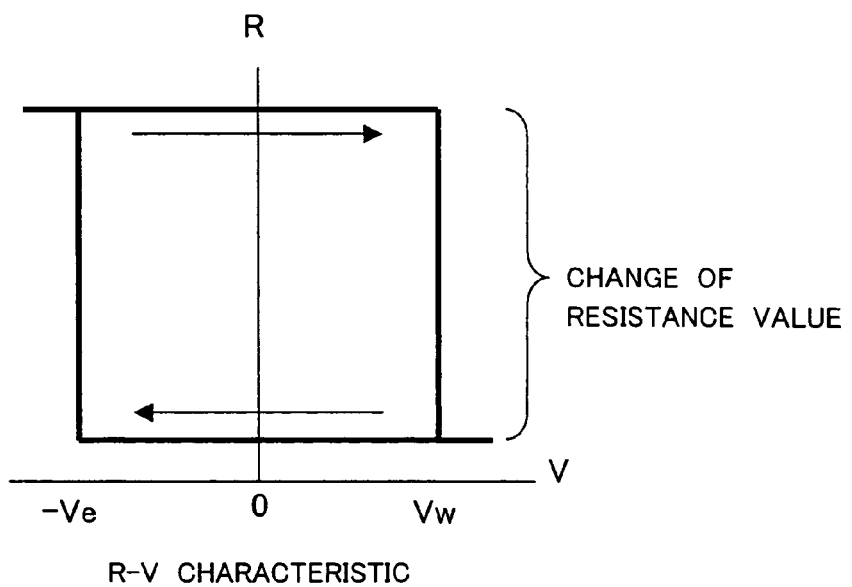
R-V CHARACTERISTIC

FIG. 7
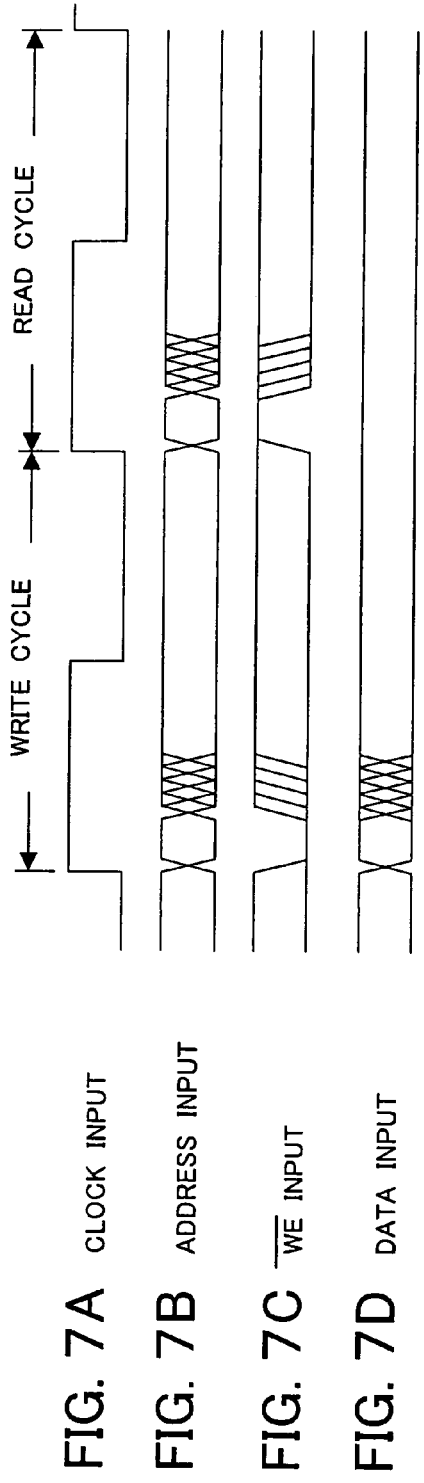
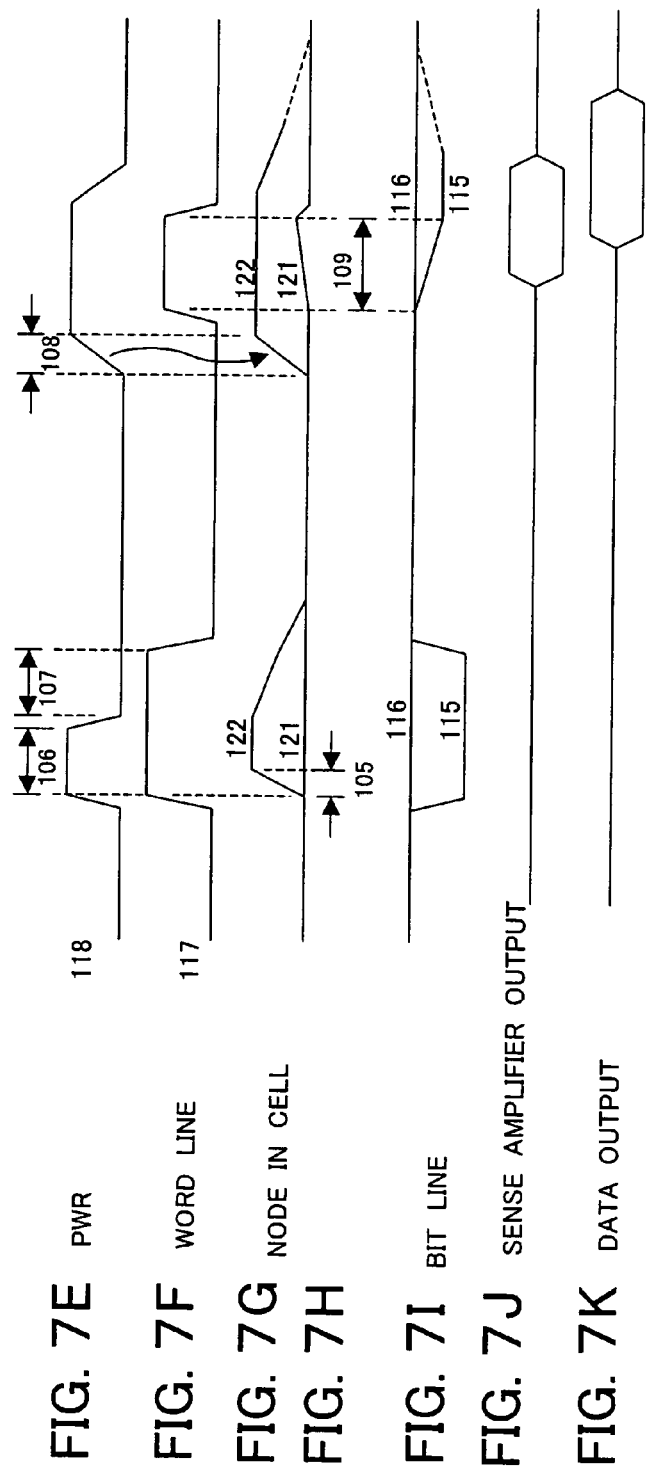
FIG. 7A CLOCK INPUT
FIG. 7B ADDRESS INPUT
FIG. 7C WE INPUT
FIG. 7D DATA INPUT
FIG. 7E PWR
FIG. 7F WORD LINE
FIG. 7G NODE IN CELL
FIG. 7H
FIG. 7I BIT LINE
FIG. 7J SENSE AMPLIFIER OUTPUT
FIG. 7K DATA OUTPUT

NONVOLATILE MEMORY CELL, STORAGE DEVICE AND NONVOLATILE LOGIC CIRCUIT

CROSS REFERENCE TO RELATED APPLICATION

The present invention contains subject matter related to Japanese Patent Application No. 2005-238609 filed in the Japan Patent Office on Aug. 19, 2005 and Japanese Patent Application No. 2005-245997 filed in the Japan Patent Office on Aug. 26, 2005, the entire contents of which being incorporated herein by reference.

BACKGROUND OF THE INVENTION

1. Field of the Invention

The present invention relates to a nonvolatile memory cell obtained by using a resistance element that includes two electrode films between which a recording film is sandwiched and that is given voltages having different polarities at its two electrodes to reversibly change the resistance value of the recording film, that is, a so-called nonvolatile variable resistance type storage element, which replaces a p-channel metal oxide semiconductor (PMOS) transistor of a six-transistor-type static random access memory (SRAM) memory cell, or by adding this to a six-transistor-type SRAM memory cell to add a nonvolatile function to a SRAM memory cell, and to a storage device and a nonvolatile logic circuit using the same.

2. Description of the Related Art

A six-transistor-type SRAM cell is one of the most general memory cells in semiconductors and is widely used in memory products and logic products. It is very excellent in terms of high speed performance and stable operation. However, when the power is turned off, the stored information will be erased, and therefore this memory cell cannot be used as it is for a nonvolatile memory.

On the other hand, a flash memory is generally used as a nonvolatile memory, but both of the NOR type and the NAND type are slow in write and erase speeds, taking, for example, 10 microseconds to 10 milliseconds, and are limited in rewrites to about 100,000 times, and therefore may be suitable for data storage applications and file storage applications, but cannot be said to be suitable as general purpose nonvolatile memories.

Further, as a memory system combining different functions, there is a memory combining an SRAM and a flash memory (EEPROM) and backing up information of the SRAM to the flash memory when the power is turned off.

SUMMARY OF THE INVENTION

However, the write/erase speed of the flash memory for backing up the data is slow, i.e., 10 microseconds to 10 milliseconds. This is inconvenient in the operation of a system, frequently turning on/off the power for reducing the power consumption.

On the other hand, a flip-flop circuit is very generally used as a circuit for temporarily storing information, such as a counter or a shift register, in a logic circuit. However, when the power is turned off, the information is erased, and therefore the required data is stored in a separately provided nonvolatile memory before the power is turned off.

Further, as an attempt for making a flip-flop circuit nonvolatile, for example, there is a proposal to use a magnetoresistive random access memory (MRAM) as a nonvolatile storage element, but the circuit becomes larger in size (that is, the circuit area increases and the cost becomes high), and therefore further development is necessary for putting this into practical use. This proposal is disclosed in, for example, Japanese Patent Publication (A) No. 2003-233990.

It is desirable to provide a nonvolatile memory cell enabling random access and enabling a high speed operation comparable to an SRAM.

It is also desirable to provide a storage device using a nonvolatile memory cell enabling a high speed operation.

It is further desirable to provide a nonvolatile logic circuit.

According to a first embodiment of the present invention, there is provided a memory cell having a pair of inverters that include a pair of field effect transistors and a pair of nonvolatile variable resistance elements connected to drain terminals of the transistors and that have cross-coupled input/output terminals and a power supply line connected to other terminals of the nonvolatile variable resistance elements and supplied with a control voltage.

Preferably, the nonvolatile variable resistance elements perform a write or erase operation by voltages of different polarities being applied to the two terminals of the variable resistance elements.

According to a second embodiment of the present invention, there is provided a memory cell having a cross coupled pair of inverters including N-channel field effect transistors and P-channel field effect transistors serially connected, a pair of nonvolatile variable resistance elements connected to storage nodes of the cross coupled pair of inverters, and a power supply line connected to first terminals of the nonvolatile variable resistance elements and to which a control voltage is supplied.

Preferably, the nonvolatile variable resistance elements perform a write or erase operation by being supplied with voltages of different polarities at their two terminals.

According to a third embodiment of the present invention, there is provided a storage device having memory cells, each having a pair of inverters having a pair of field effect transistors and a pair of nonvolatile variable resistance elements connected to drain terminals of the transistors and having cross-coupled input/output terminals and a power supply line connected to other terminals of the nonvolatile variable resistance elements and supplied with a control voltage, arranged in a matrix, a word line commonly connecting gate terminals of access transistors of the memory cells in a row direction, a pair of bit lines commonly connecting drain terminals of the access transistors in a column direction, and a control circuit supplying a control voltage to the power supply line commonly connected to first terminals of the variable resistance elements for changing the characteristics of the variable resistance elements.

Preferably, the nonvolatile variable resistance elements perform a write or erase operation by being supplied with voltages of different polarities at their two terminals.

Preferably, the control circuit supplies the power supply line with a pulse of the first reference voltage when performing a write operation, erase operation, or read operation on the memory cells and sets it to a second reference voltage other than when performing a write operation on the memory cells.

Preferably, the control circuit performs a write or erase operation on nonvolatile variable resistance elements in the memory cells by setting the word lines at a high potential to conduct access transistors and, in that state, setting the power supply line at a high potential to erase information of the nonvolatile variable resistance elements in the memory cells, then, while leaving the access transistors conductive, setting the power supply line at a low potential to write in the nonvolatile variable resistance elements in the memory cells and performs a read operation on the memory cells by setting the word lines a low potential to close the access transistors and, in that state, setting the power supply line a high potential to transfer information from the nonvolatile variable resistance elements to memory cell storage nodes, and then setting the word lines at a high potential to conduct the access transistors and read information of the memory cells.

Preferably, the control circuit supplies the power supply line with a pulse of the first reference voltage when performing a write operation on the memory cells and sets it to a second reference voltage other than when performing a write operation on the memory cells.

Preferably, the control circuit performs a write or erase operation on nonvolatile variable resistance elements in the memory cells by setting the word lines at a high potential to conduct access transistors and, in that state, setting the power supply line at a high potential to erase information of the nonvolatile variable resistance elements in the memory cells, and then, while leaving the access transistors conductive, setting the power supply line at a low potential to write in the nonvolatile variable resistance elements in the memory cells.

Preferably, when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

According to a fourth embodiment of the present invention, there is provided a storage device having memory cells, each having a cross coupled pair of inverters having N-channel field effect transistors and P-channel field effect transistors serially connected, a pair of nonvolatile variable resistance elements connected to storage nodes of the cross coupled pair of inverters, and a power supply line connected to a first terminal of the nonvolatile variable resistance, arranged in a matrix, a word line commonly connecting gate terminals of access transistors of the memory cells in a row direction, a pair of bit lines commonly connecting drain terminals of the access transistors in a column direction, and a control circuit supplying a control voltage to the power supply line commonly connected to first terminals of the variable resistance elements for changing the characteristics of the variable resistance elements.

Preferably, the nonvolatile variable resistance elements perform a write or erase operation by being supplied with voltages of different polarities at their two terminals.

Preferably, the control circuit supplies the power supply line with a pulse of the first reference voltage when performing a write operation on the memory cells and sets it to a second reference voltage other than when performing a write operation on the memory cells.

Preferably, the control circuit performs a write or erase operation on nonvolatile variable resistance elements in the memory cells by setting the word lines at a high potential to conduct access transistors and, in that state, setting the power supply line at a high potential to erase information of the nonvolatile variable resistance elements in the memory cells, and then, while leaving the access transistors conductive, setting the power supply line at a low potential to write in the nonvolatile variable resistance elements in the memory cells.

Preferably, when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

Preferably, while the power supplies of the memory cells are at a normal power potential immediately before the power is turned off, the control circuit changes the power supply line to a low potential so as to write information of storage nodes of the memory cells in the nonvolatile variable resistance elements.

Preferably, when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

According to a fifth embodiment of the present invention, there is provided a nonvolatile logic circuit having a flip-flop circuit that for a pair of inverters with output terminals cross coupled with each other's input terminals and an additional circuit having a pair of nonvolatile variable resistance elements with first terminals connected to storage nodes of the flip-flop circuit and a second power supply line to which other terminals of the nonvolatile variable resistance elements are connected and provided separate from a first power supply line of the inverters to which a control voltage is supplied and driving the second power supply line by the control voltage so as to store data of the flip-flop circuit in the nonvolatile variable resistance elements when the first power supply line is turned off.

Preferably, the nonvolatile variable resistance elements perform a write or erase operation by being supplied with voltages of different polarities at their two terminals.

According to the present invention, a nonvolatile storage device enabling random access and enabling a high speed operation comparable to an SRAM can be obtained. Further, a flip-flop circuit having a nonvolatile function is realized which, even when the power is turned off, stores the state immediately before that, which enables operation to be continued from that state after turning on the power again.

BRIEF DESCRIPTION OF THE DRAWINGS

These and other objects and features of the present invention will become clearer from the following description of the preferred embodiments given with reference to the accompanying drawings, in which:

FIG. 4 is a diagram showing characteristics of a nonvolatile variable resistor;

FIG. 7 is a timing chart for explaining a random write/random read operation of the nonvolatile memory cell of FIG. 2;

DESCRIPTION OF THE PREFERRED EMBODIMENTS

The above nonvolatile storage device enabling random access and enabling a high speed operation comparable to an SRAM hereinafter will be called a nonvolatile SRAM for convenience.

The nonvolatile SRAM using an embodiment of the present invention operates by the following systems.

First, there is described a system of performing a write/erase operation on a nonvolatile variable resistance element (hereinafter, also described as an "ARAM element") every time when writing data into a memory cell and performing a read operation from the ARAM element every time when reading data from the memory cell. Hereinafter, this system will be referred to as "type I" or a "random write/random read operation type".

Second, there is described a system of performing a write/erase operation on an ARAM element at every time when writing data into a memory cell, performing a read operation as an SRAM cell and using the ARAM element as only the load of the memory cell in a period when the power is on when reading data from the memory cell, and performing an operation of transferring the data stored in the ARAM element to the SRAM cell only when turning on the power. Hereinafter, this system will be referred to as a "type II" or an "random write/power-on read operation type".

Both have advantages and disadvantages in performance, but "type I" enables the supply of power to be turned off completely when not accessing the memory cell, and therefore this type features a reduction of the power consumption (particularly, the power consumption at the time of stand-by is zero). On the other hand, type II features the point that a high speed operation comparable to an SRAM is possible because the memory cell operates as an SRAM cell in the period when the power is on.

Third, there is described the system of performing a write/read operation as an SRAM cell in the period when the power is on and performing a write operation of data stored in the SRAM cell to an ARAM element immediately before turning off the power and a transfer operation of data stored in the ARAM element to the SRAM cell when turning on the power. Hereinafter, this system will be referred to as a "type III" or a "power-off write/power-on read operation type". This type III can also perform a high speed operation comparable to an SRAM and lower the power consumption.

Below, the configurations of the memory cell and the nonvolatile storage device relating to these and their operations will be explained.

First Embodiment

Figure 1:
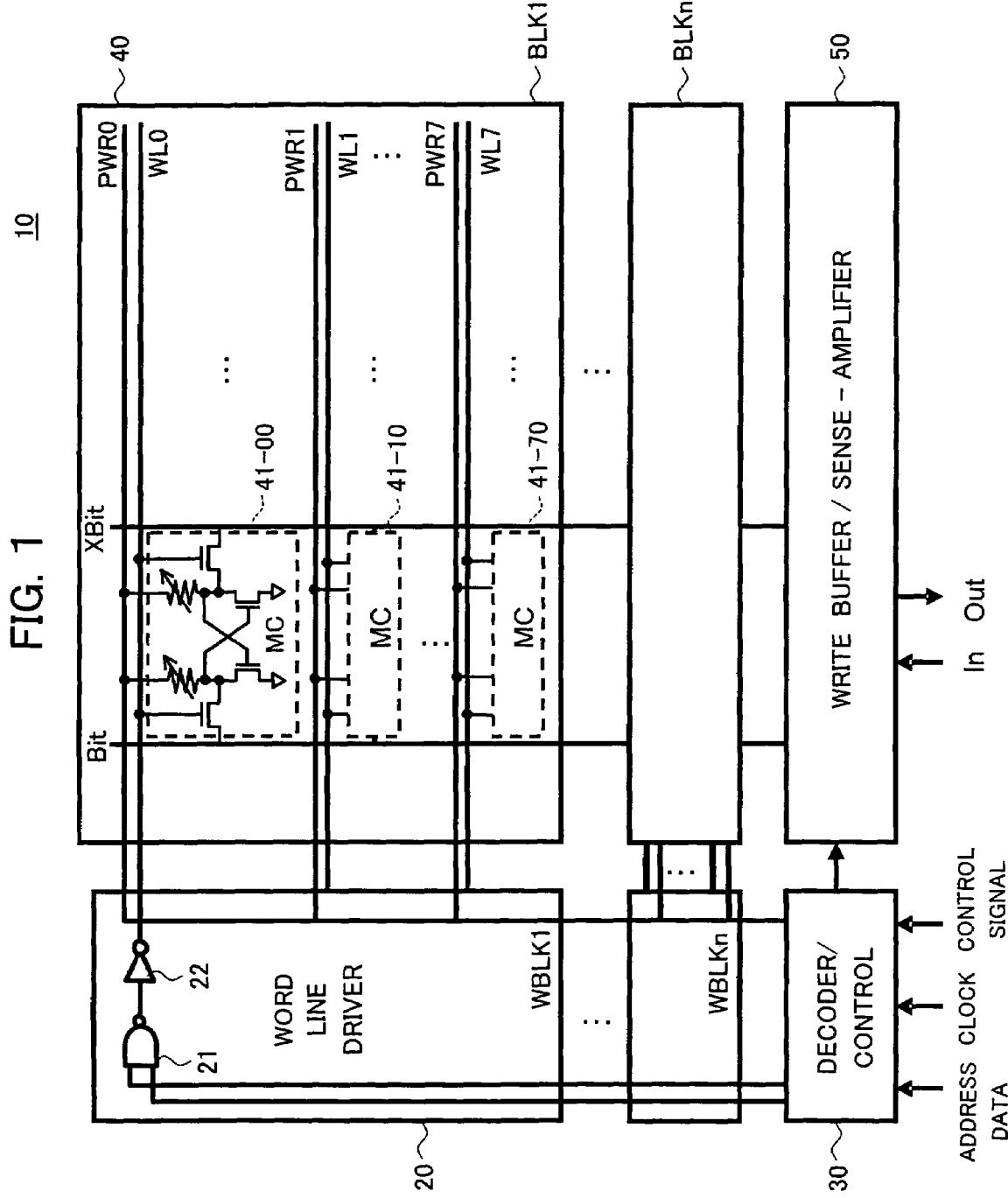
FIG. 1 is a configuration of a nonvolatile storage device of an embodiment of the present invention.

FIG. 1 is a block diagram of the configuration of a nonvolatile storage device 10 according to an embodiment of the present invention.

The nonvolatile storage device 10 is configured by a word line driver (word driver) circuit 20, a decoder/control circuit 30, a write buffer/sense-amplifier (Sense-Amp) circuit 50, a memory cell MC portion 40, etc.

In FIG. 1, for simplification, only one word driver circuit 20 and one memory block BLK1 are shown, but there are actually $2^n/2^3$ memory blocks (BLK1) in which word lines are arranged in units of, for example, $2^3$ (n is a positive integer and number of row address bits).

In FIG. 1, there are $2^3$ word lines in the blocks (WBLK1 to WBLKn) of the word driver circuit 20. These are shown as WL0 to WL7. Memory cells MC (41-00, 41-10, . . . , 41-70, . . . ) are connected to the word lines (lines).

The decoder/control circuit 30 is configured by a pre-decoder, an internal timing control circuit, etc. and receives as input and decodes the address data. Further, it generates an internal clock signal, a control signal, etc. generated based on an external clock (CK).

As the decoder circuit (30), in order to decrease the number of transistors and decrease the area thereof and, at the same time, enable a high speed operation, a pre-decoder system designed to increase the storage capacity, increase the speed, and lower the power consumption is generally used.

When a multi-bit address is input, this pre-decoder system decodes it by dividing the address into a plurality of groups in units of, for example, 2 bits or 3 bits, selecting a specific group from among these groups, and selecting one word line from among the 2 bits or 3 bits of word lines in this selected group. This reduces the power consumption.

Further, if decreasing the number of bits in the selected decoder, the load of the address buffer can be reduced and the operation speed can be made faster, while if increasing the number of bits in the decoder, the area occupied by the interconnects can be reduced, but the load of the address buffer increases and the operation speed becomes slower. For this reason, there are many examples where the word lines in one block configured by the word driver circuit 20 have 2 or 3 bit configurations, as explained above.

The decoder circuit (30) includes, other than the row address decoder, a column address decoder. This column address decoder selects an address in a column based on the input address data.

When the control signal and the clock signal (CK) are supplied from the outside, a timing control circuit of the control circuit (30) outputs a timing signal for decoding address signals A[0] to A[n] to the pre-decoder and the word driver circuit 20 in response to, for example, a control signal.

Further, other than this, it generates an internal clock (PCLK), outputs the control signal, for example, WE (write enable) signal to the write buffer circuit, and controls the writing timing.

From the control circuit (30), paired together with word lines, power supply lines PWR0 to PWR7 are provided in the row direction and connected to first terminals of nonvolatile variable resistance elements of the memory cells MC.

When a specific memory cell MC is selected, the power supply line is turned on/off at the time of normal operation or the voltage is raised at a predetermined timing before turning on the power (ON) or the voltage is made variable after turning off of the power supply (OFF), and the voltage supplied to the variable resistance element is controlled to thereby perform the write, erase, and read operations of the data.

Further, the control circuit (30) outputs a Sense-Amp enable signal to the sense-amplifier (Sense-Amp) circuit (50) for amplifying the data on a bit line Bit and an inverted bit line XBit (inversion of Bit).

Further, it outputs a timing signal for controlling the column addresses [An+1] to [Am] (data) output from the column decoder.

One word driver circuit 20 is selected by the pre-decoder. To this selected specific word driver circuit 20, the clock (PCLK) and the data output from the decoder/control circuit 30 are supplied.

In the block of this selected word driver circuit 20, for example, in a case where the unit of the decoder is 3 bits, by the supply of a voltage of the "H" (high) level from eight word lines to one word line, the row direction of the memory cells MC (41-0 to 41-7) is activated. Further, simultaneously with this, voltages of the "L" (low) level are supplied to the other seven word lines, whereby they are inactivated.

Each word driver circuit 20 is specifically configured, as shown in FIG. 1 as an example, by, for example, a NAND and NOT logic circuit. The control signal clock and the data output from the decoder/control circuit 30 are supplied to the NAND logic circuit and computed, and then the logical result thereof is inverted at the NOT logic circuit and output to word lines WL0 to WL7 for driving the memory cells MC (41-00, 41-10, . . . ).

Then, voltage is supplied to the power supply line (PWR0 to PWR7) corresponding to this activated word line at a predetermined timing, and an erase, write, or read operation of the data of the nonvolatile variable resistance element is carried out.

When a write enable (WE) signal and a column selection signal from the column decoder are supplied to the write buffer circuit forming part of the write buffer/sense-amplifier circuit 50 and a specific column is selected, read and write operations of data are carried out.

At the time of a read operation, the stored data is read out from the ARAM element first and stored in the SRAM cell based on a signal from the internal timing control circuit. Thereafter, the data of the selected memory cell MC is output onto a bit line pair Bit and XBit, this data is amplified at the sense-amplifier circuit (50), and the data is output (Out) via the output buffer of the write buffer/sense-amplifier circuit 50.

On the other hand, at the time of a write operation, data is supplied via the input terminal to the write buffer/sense-amplifier circuit 50. When the bit line pair Bit and XBit selected by the column selection signal is selected, data is written into the memory cell MC via the write buffer circuit and the bit line pair Bit and XBit.

In order to store the data of the memory cell in the ARAM element when the power is off, the word line and the power supply line are controlled in a write cycle period and erase and write operations of the data are carried out. Further, other than this, when the power is on, the power supply line is controlled and raised earlier than the other power supplies to thereby enable a read operation of the data from the ARAM element.

The memory cell (MC) portion 40 has a plurality of memory cells MC41-00 to MC41-nm, such as SRAM cells arranged in a matrix. Generally, MC41-00 to MC41-0m are commonly connected to the same word line and power supply line, MC-00 to MC-n0 are commonly connected to the bit line pair Bit and XBit, and this bit line pair Bit and XBit is connected to the sense-amplifier (50).

The example of the memory cell MC portion 40 in FIG. 1 shows only one column of nonvolatile SRAMs. In actuality, it is configured by a plurality of columns.

The operations of the principal parts of the nonvolatile storage device 10 shown in FIG. 1 will be explained later by using the circuit configuration of a memory cell and the timing chart.

Figure 2:
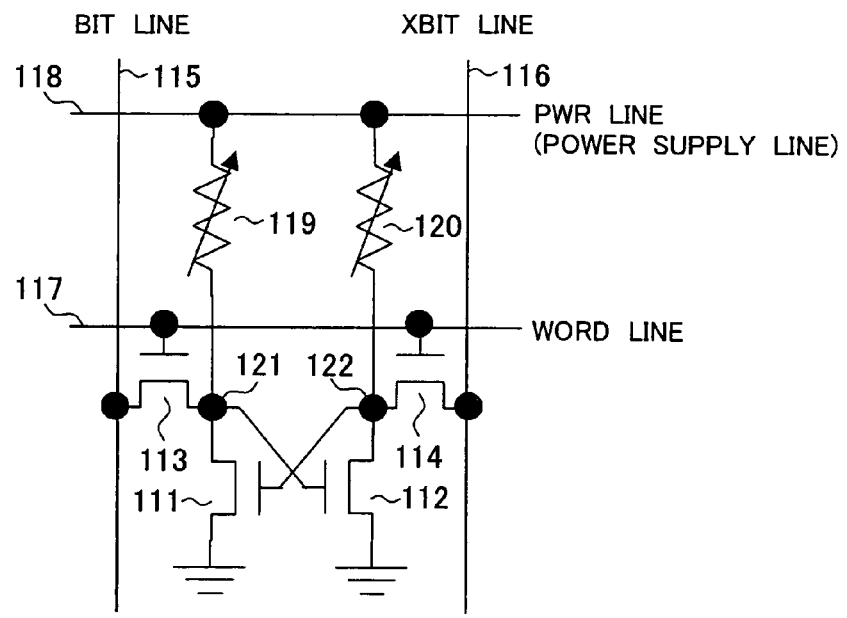
FIG. 2 is a circuit diagram of a nonvolatile memory cell of the embodiment of the present invention.
Figure 3:
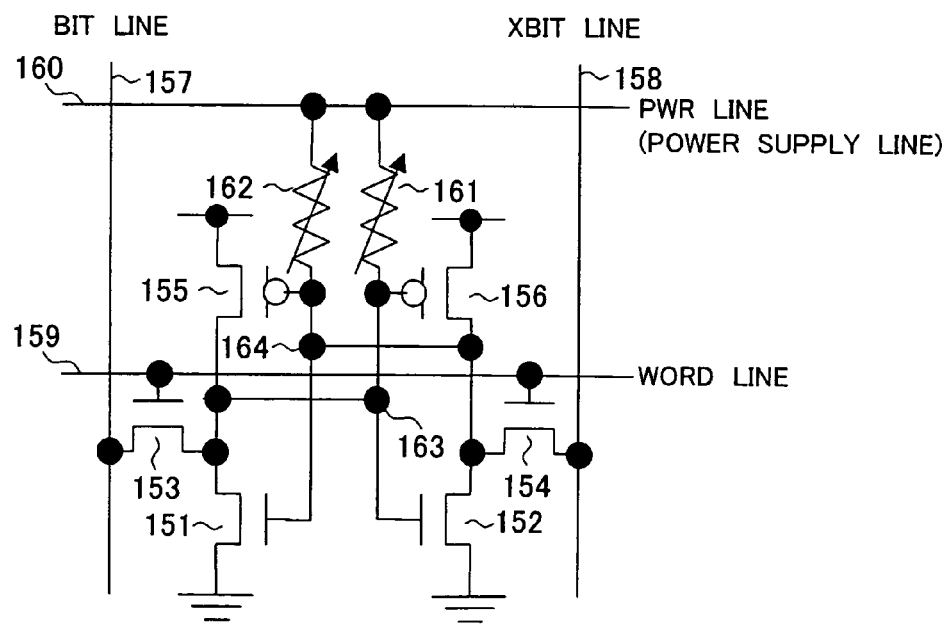
FIG. 3 is a circuit diagram of a nonvolatile memory cell of the embodiment of the present invention.

The circuit configuration of an embodiment of a memory cell MC of the memory cell MC portion 40 of FIG. 1 is shown in FIG. 2 and FIG. 3.

Second Embodiment

In a memory cell MC 100 shown in FIG. 2, a drain of an N channel metal oxide semiconductor (NMOS) transistor 111 is connected to a drain/source of an NMOS transistor 113 of the transfer gate and one terminal of a variable resistance element 119, a gate of the transistor 111 is connected to the drain of an NMOS transistor 112, and a source of the transistor 111 is connected to a reference voltage, for example, GND (ground).

The other terminal of the variable resistance element 119 is connected to a power supply (PWR) line 118. The gate of the NMOS transistor 113 is connected to a word line 117, and its source/drain is connected to a bit line 115.

In the same way, the drain of the NMOS transistor 112 is connected to the drain/source of an NMOS transistor 114 of the transfer gate and one terminal of a variable resistance element 120, its gate is connected to the drain of the NMOS transistor 111, and its source is connected to the reference voltage, for example, GND (ground).

The other terminal of the variable resistance element 120 is connected to the power supply line 118. The gate of the NMOS transistor 114 is connected to the word line 117, and its source/drain is connected to an XBit (inversion of bit line) line 116.

The operation of this memory cell MC100 will be explained later.

Third Embodiment

FIG. 3 shows the circuit configuration of a memory cell MC 150 as another embodiment.

The memory cell MC150 shown in FIG. 3 is configured by PMOS transistors 155 and 156, NMOS transistors 151, 152, 153, and 154, and variable resistance elements 161 and 162.

A word line 159 is connected to gates of the NMOS transistors 153 and 154 of the transfer gate, and a bit line 157 and an inverted bit (XBit) line 158 are connected to drains/sources of the NMOS transistors 153 and 154.

The source of the PMOS transistor 155 is connected to the power supply, and its drain is connected to the drain of the NMOS transistor 151 and the source/drain of the NMOS transistor 153. Further, the source of the NMOS transistor 151 is connected to a reference potential, for example, the GND (ground).

In the same way, the source of the PMOS transistor 156 is connected to the power supply, and its drain is connected to the drain of the NMOS transistor 152 and the source/drain of the NMOS transistor 154. Further, the source of the NMOS transistor 152 is connected to a reference potential, such as the GND (ground).

Then, gates of the PMOS transistor 155 and the NMOS transistor 151 are commonly connected, and the commonly connected gates are connected to commonly connected drains of the PMOS transistor 156 and the NMOS transistor 152.

The gates of the PMOS transistor 156 and the NMOS transistor 152 are commonly connected, and the commonly connected gates are connected to commonly connected drains of the PMOS transistor 155 and the NMOS transistor 151.

The variable resistance element 162 is connected between the commonly connected gates of the PMOS transistor 155 and the NMOS transistor 151 and a power supply line (PWR) 160, and the variable resistance element 161 is connected between the commonly connected gates of the PMOS transistor 156 and the NMOS transistor 152 and the power supply line 160.

By setting a high voltage or low voltage by considering the polarity of the voltage supplied to this power supply line 160, resistance values of the variable resistance elements 161 and 162 are made variable, and the write, erase, and read operations of data are carried out.

Figure 5:
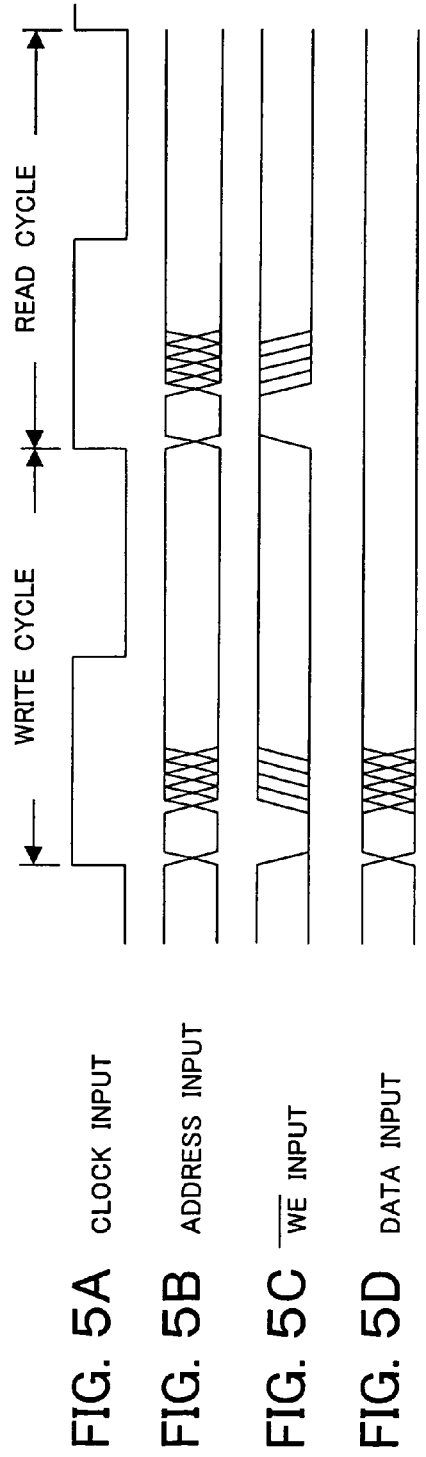
FIG. 5 is a timing chart for explaining a random write/power-on read operation of the nonvolatile memory cell of FIG. 2.
Figure 5:
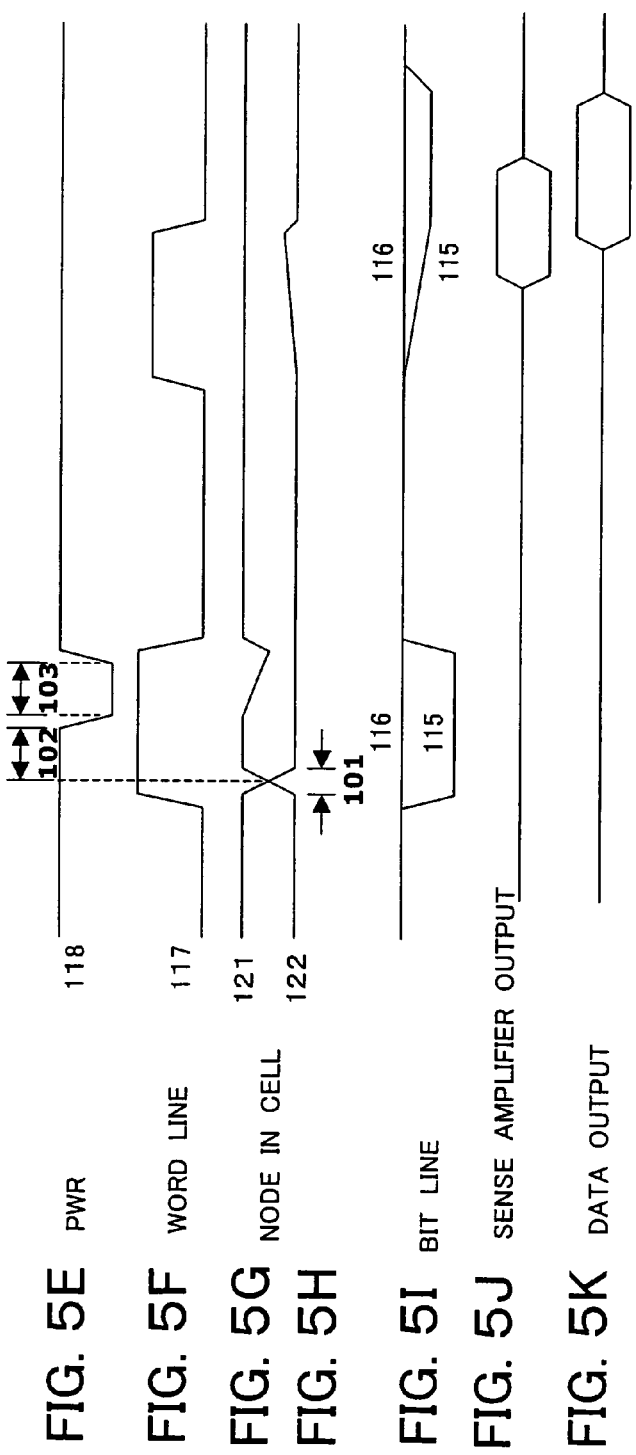

Next, the operation of the memory cell MC100 will be explained by using FIG. 2, FIG. 4, and FIG. 5. FIG. 5 is a timing chart for explaining the operation of this memory cell MC100. Further, FIG. 4 shows the electric characteristics (I-V characteristics and R-V characteristics) of the nonvolatile variable resistance elements 119, 120, 161, and 162.

First, the random write/power-on read operation type (type II) will be explained.

In an initial state, assume that a storage node 121 in the memory cell MC(100) is at a high potential, described also as the "H" level in the following explanation, and a storage node 122 is in a low potential, also described as an "L" level in the following explanation. At this time, the variable resistance element 119 is in the low resistance state, and the variable resistance element 120 is in the high resistance state.

Now, the case of writing reversed data into the above memory cell MC100 will be explained. During the write cycle period, when the clock input is at the "H" level, the data is input (FIG. 5(D)).

Corresponding to this input data, the bit (Bit) line 115 is brought to a low potential, for example, the ground potential, and the inverted bit (XBit) line 116 is brought to a high potential, for example, the power supply potential, to supply voltage of the "H" level to the word line 117. When the voltage of this "H" level is supplied to the gates of the NMOS transistors 113 and 114 of the transfer gate, they become conductive, the voltage of the "H" level of the inverted bit (XBit) line is transferred via the NMOS transistor 114 of the transfer gate, the storage node 122 becomes the "H" level, and the voltage of this "H" level is supplied to the gate of the NMOS transistor 111, which then becomes the ON state.

The drain of the NMOS transistor 111 becomes the "L" level, and the voltage of this "L" level is fed back and supplied to the gate of the NMOS transistor 112, which becomes the OFF state. As a result, the drain of the NMOS transistor 112 is held at the "H" level.

As shown in FIG. 5(H), the potentials of the storage nodes 121 and 122 in the cell are inverted in a period of 101 and shift like the "H" level to the "L" level and the "L" level to the "H" level.

After this, when the potential of the power supply (PWR) line 118 is held at the high potential as it is in a period of 102 (illustrated in FIG. 5(E)), negative voltages of −Ve or more shown in FIG. 4 are supplied to both terminals of the variable resistance element 119, and therefore the variable resistance element 119 changes from a low resistance state to a high resistance state. Namely, in the period 102 shown in FIG. 5(E), the erase operation of the variable resistance element 119 occurs.

Next, in FIG. 5(E), when the power supply line 118 is lowered to the low potential and that state is held in a period of 103 (illustrated), positive voltages of Vw or more shown in FIG. 4 are supplied to both terminals of the variable resistance element 120, and therefore the variable resistance element 120 changes from the high resistance state to the low resistance state. Namely, the write operation of the variable resistance element 120 occurs.

After returning the power supply line 118 to the high potential, the word line 117 is closed to bring the NMOS transistors 113 and 114 of the transfer gate to the OFF state and the bit (Bit) line 115 is returned to the high potential so as to end the write operation.

The storage node 121 is at the "L" level in this state, but the variable resistance element 119 connected between this node and the power supply line 118 is in the high resistance state, and therefore an unrequired current does not flow. The storage node 122 is at the "H" level and connected with the power supply line 118 by the variable resistance element 120 in the low resistance state, and therefore the potential of the storage node 122 is held at the "H" level.

Next, the read operation will be explained. This read operation is the same as the read operation of the usual SRAM. The bit (Bit) line 115 and the inverted bit (XBit) line 116 are brought to the "H" level, and the voltage of "H" level is output to the word line 117.

When voltages of this "H" level are supplied to gates of the NMOS transistors 113 and 114 of the transfer gate, they become conductive, and voltages of the storage nodes 121 and 122 are transferred to the bit line 115 and the inverted bit line 116.

Then, the potential of the bit line on one side is slightly lowered in accordance with the potentials of the storage nodes 121 and 122 of the memory cell MC150. By detecting this very small potential difference by the sense-amplifier, the read data is output (FIGS. 5(I), 5(J), 5(K)).

At this time, the variable resistance element 120 on the "H" level side of the storage node (the storage node 122 in FIG. 5) is in the low resistance state, and therefore the power supply potential is constantly supplied to the "H" level side of the storage node. In this way, the variable resistance elements 119 and 120 act the same as the PMOS load of the six-transistor-type SRAM cell at the time of the read operation.

Figure 6:
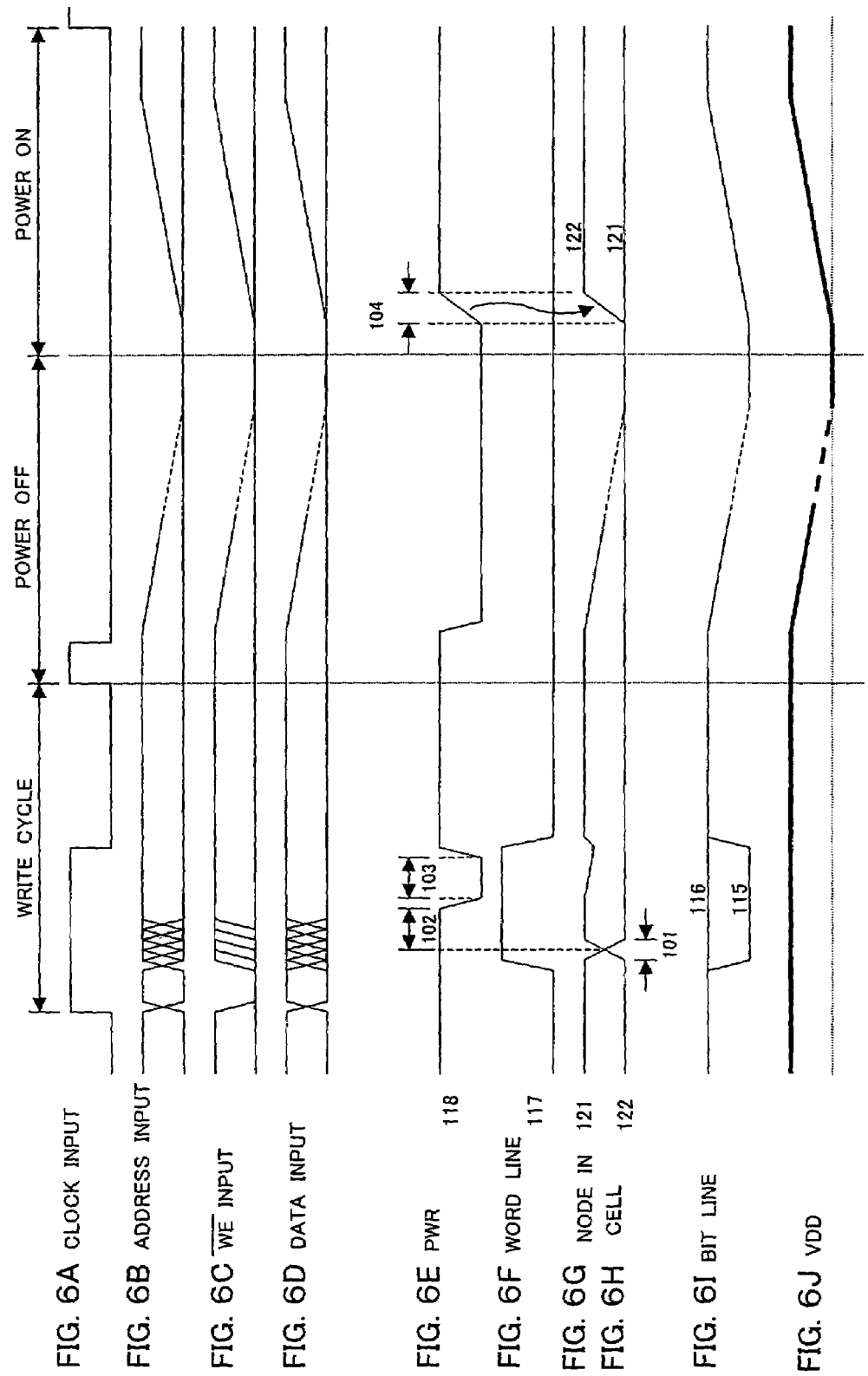
FIG. 6 is a timing chart for explaining a random write/power-on read operation of the nonvolatile memory cell of FIG. 2.

Then, even when the power is turned off in this state, the resistance values of the variable resistance elements 119 and 120 are held as they are because of the nonvolatility (FIG. 6).

Next, as shown in FIG. 6, a case where the data is read out from the variable resistance (ARAM) element at the time of turning on the power will be explained.

Assume that the variable resistance element 119 is in the high resistance state, and the variable resistance element 120 is in the low resistance state at a stage where the power is off (OFF). When the power supply line 118 is raised to the high potential before the other power supplies (a period of 104 shown in FIG. 6(E)), in accordance with the states of the variable resistance elements 119 and 120, the potentials of the storage nodes 121 and 122 in the cell become the "L" level and the "H" level (FIGS. 6(G), 6(H)).

When the voltage of the "H" level of the storage node 122 is supplied to the gate of the NMOS transistor 111, the ON operation state is exhibited, and the drain becomes the "L" level.

The voltage of the "L" level of the drain of the NMOS transistor 111 is supplied to the gate of the NMOS transistor 112, but it is in the OFF state.

Namely, the voltage levels of the storage nodes 121 and 122 are stably held in their states by the positive feedback of the driver NMOS transistors 111 and 112. Thereafter, it becomes possible to perform the write and read operations explained before.

Next, the operation of the random write/random read operation type (type I) by using the memory cell MC100 shown in FIG. 2 will be explained.

FIG. 7 is a timing chart of the random write/random read operation of the memory cell MC100 of an embodiment of the present invention.

In the initial state, the data are held in the variable resistance elements 119 and 120. For example, assume that the variable resistance element 119 is in the low resistance state, and the variable resistance element 120 is in the high resistance state. Assume that the potential of the power supply line 118 is at the "L" level, and both of the storage nodes 121 and 122 in the memory cell MC are at the "L" level since a sufficiently long time passes after the word line 117 is closed.

Now, a case of writing the opposite data into the above memory cell MC100 will be explained. As shown in FIG. 7(A), when the clock input in the write cycle period is at the "H" level, the bit (Bit) line 115 is brought to the low potential, for example, the ground potential, and the inverted bit (XBit) line 116 is brought to the high potential, for example, the power supply potential, and the voltage of the "H" level is supplied to the word line 117. Then, the voltage of this "H" level is supplied to the gates of the NMOS transistors 113 and 114 of the transfer gate, whereby they become conductive.

When the word line 117 becomes open, the storage node 121 in the memory cell MC is at the "L" level as it is and does not change in a period of 105 shown in FIGS. 7(G) and 7(H), but the storage node 122 rises to the high potential ("H" level). At this time, when the potential of the power supply line 118 is changed to the high potential in a period of 106 shown in FIG. 7(E), a negative voltage of −Ve or more is supplied to the variable resistance element 119, and therefore it changes from the low resistance state to the high resistance state (FIG. 4). Namely, the erase operation of the variable resistance element 119 occurs.

Next, when the power supply line 118 is lowered to the low potential and the state where the word line 117 is open is held in a period of 107 shown in FIGS. 7(E) and 7(F), the voltage of Vw or more is applied to the variable resistance element 120 this time, and therefore it changes from the high resistance state to the low resistance state. Namely, the write operation of the variable resistance element 120 occurs.

Thereafter, the word line 117 is changed from the "H" level to the "L" level to close (turn off) the NMOS transistors 113 and 114 of the transfer gate and return the bit (Bit) line 115 to the high potential, whereby the write operation ends.

At this point of time, the variable resistance element 119 becomes the high resistance and the variable resistance element 120 becomes the low resistance, and this state is held. The storage node 122 is at the high potential at the point of time when the word line 117 is closed, but the power supply line 118 is at the low potential and there is no supply of power, and therefore it settles down at the ground potential soon due to the leakage current inside the memory cell MC 100.

Next, the read operation will be explained by using FIG. 7.

In a read cycle period of FIG. 7, when the power supply line 118 is raised to the high potential while keeping the closed state of the "L" level of the word line 117 (a period of 108 shown in FIG. 7(E)) first, in accordance with the states of the variable resistance elements 119 and 120, the potentials of the storage nodes 121 and 122 in the cell become the "L" level and the "H" level, and this state is stably held by the positive feedback of the NMOS transistors 111 and 112.

Therefore, when the potential of the word line 117 is made high by bringing the bit (Bit) line 115 and the inverted bit (XBit) line 116 to the "H" level, the NMOS transistors 113 and 114 of the transfer gate become conductive.

The potentials of the storage nodes 121 and 122 of the memory cell MC100 are transferred via the transfer gate to the bit line 115 and the inverted bit line 116, the bit line potential on one side is slightly lowered in accordance with the difference of transferred potentials, and this very small potential difference is detected at the sense-amplifier, whereby the read data is output.

By closing the word line 117 at a stage where the potential difference between the bit lines (Bit: 115, XBit: 116) is sensed at the sense-amplifier and returning the power supply line (118) potential to the "L" level after that, the read operation ends. The storage node (121, 122) potentials in the memory cell settle down soon at the ground potential in the same way as the time of the write operation.

As explained above, when the present invention is used, a nonvolatile memory device enabling random access and enabling high speed operation comparable to an SRAM can be obtained.

Next, the memory cell operations of the random write/power-on read operation type and the power-down write/power-on read operation type using the memory cell MC150 shown in FIG. 3 will be explained as another embodiment.

Figure 8:
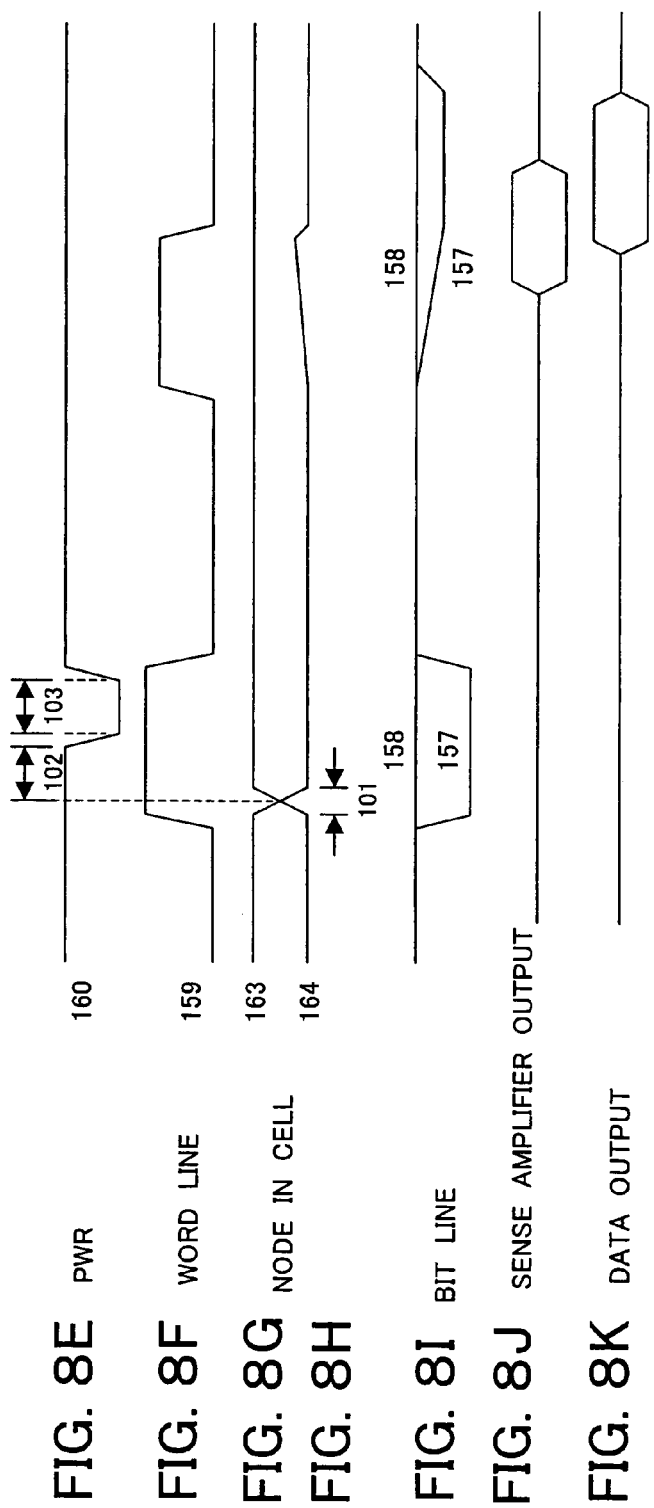
FIG. 8 is a timing chart for explaining a random write/power-on read operation of the nonvolatile memory cell of FIG. 3.

First, the operation of the random write/power-on read operation type in the memory cell MC150 shown in FIG. 3 will be explained by using FIG. 8 and FIG. 9.

Assume that a storage node 163 in the memory cell MC (150) is at the high potential ("H" level), and a storage node 164 is in the low potential ("L" level) state in the initial state. At this time, the variable resistance element 161 is in the low resistance state, and the variable resistance element 162 is in the high resistance state.

The case of writing the opposite data into the above memory cell MC150 is explained now. When the voltage of the "H" level is output to the word line 159 by bringing the bit (Bit) line 157 to the low potential, for example, the ground potential, and bringing the inverted bit (XBit) line 158 to the high potential, for example, the power supply potential, voltages of this "H" level are applied to the gates of the NMOS transistors 153 and 154 of the transfer gate, whereby they become conductive (open).

When the voltages of the "H" level are supplied to the common gate of the PMOS transistor 155 and the NMOS transistor 151 via the NMOS transistor 154 of the transfer gate, the NMOS transistor 151 becomes ON, and its drain output becomes the "L" level. This "L" level of the drain output of the NMOS transistor 151 is fed back to the commonly connected gates of the PMOS transistor 156 and the NMOS transistor 152, and, as a result, the PMOS transistor 156 becomes ON and the drain output becomes the "H" level.

By configuring a first inverter by the PMOS transistor 155 and the NMOS transistor 151 and configuring a second inverter by the PMOS transistor 156 and the NMOS transistor 152 in this way, and feeding back outputs to inputs of the other inverters to each other, a latch circuit is configured, and thus the data (voltage) can be held.

Accordingly, the potentials of the storage nodes 163 and 164 in the cell are inverted in the period of 101 shown in FIGS. 8(G) and 8(H) and change as "H" level to "L" level and "L" level to "H" level.

When the potential of the power supply line 160 is held at the high potential as it is in the period of 102 shown in FIG. 8(E), negative voltages of −Ve or more shown in FIG. 4 are supplied to both terminals of the variable resistance element 161, therefore the variable resistance element 161 and changes from the low resistance state to the high resistance state. Namely, an erase operation of the variable resistance element 161 occurs.

Next, when the power supply line 160 is boosted down to the low potential and that state is held in the period of 103 shown in FIG. 8(E), positive voltages of Vw or more shown in FIG. 4 are supplied to both terminals of the variable resistance element 162 this time, and therefore the variable resistance element 162 changes from the high resistance state to the low resistance state. Namely, the write operation of the variable resistance element 162 occurs.

By closing the word line 159 and returning the bit line 157 to the high potential after returning the power supply line 160 to the high potential, the write operation ends. In this state, the storage node 163 is at the "L" level, but the variable resistance element 161 between it and the power supply line 160 is in the high resistance state, and therefore an unrequired current does not flow.

Next, a read operation will be explained by using FIG. 8. This read operation is the same as the read operation of the usual SRAM.

When bringing the bit line 157 and the inverted bit line 158 to the "H" level and opening the word line 159, the bit line potential on one side is slightly lowered in accordance with the potentials of the storage nodes 163 and 164 of the memory cell MC150. By detecting this very small potential difference by the sense-amplifier, the read data is output (FIGS. 8(I), 8(J), 8(K)).

At this time, the variable resistance element 162 on the "H" level side of the storage node (storage node 164 in FIG. 8) is in the low resistance state, therefore the second power supply potential is always supplied to the "H" level side of the storage node, and the operation stability, such as noise margin, further increases over the usual six-transistor-type SRAM cell.

In this way, the variable resistance elements 161 and 162 act the same as the PMOS load of a six-transistor-type SRAM cell at the time of a read operation.

Then, even when turning off in this state, resistance values of the variable resistance elements 161 and 162 are held as they are because of the nonvolatility (FIGS. 9(G), 9(H)).

Figure 9:
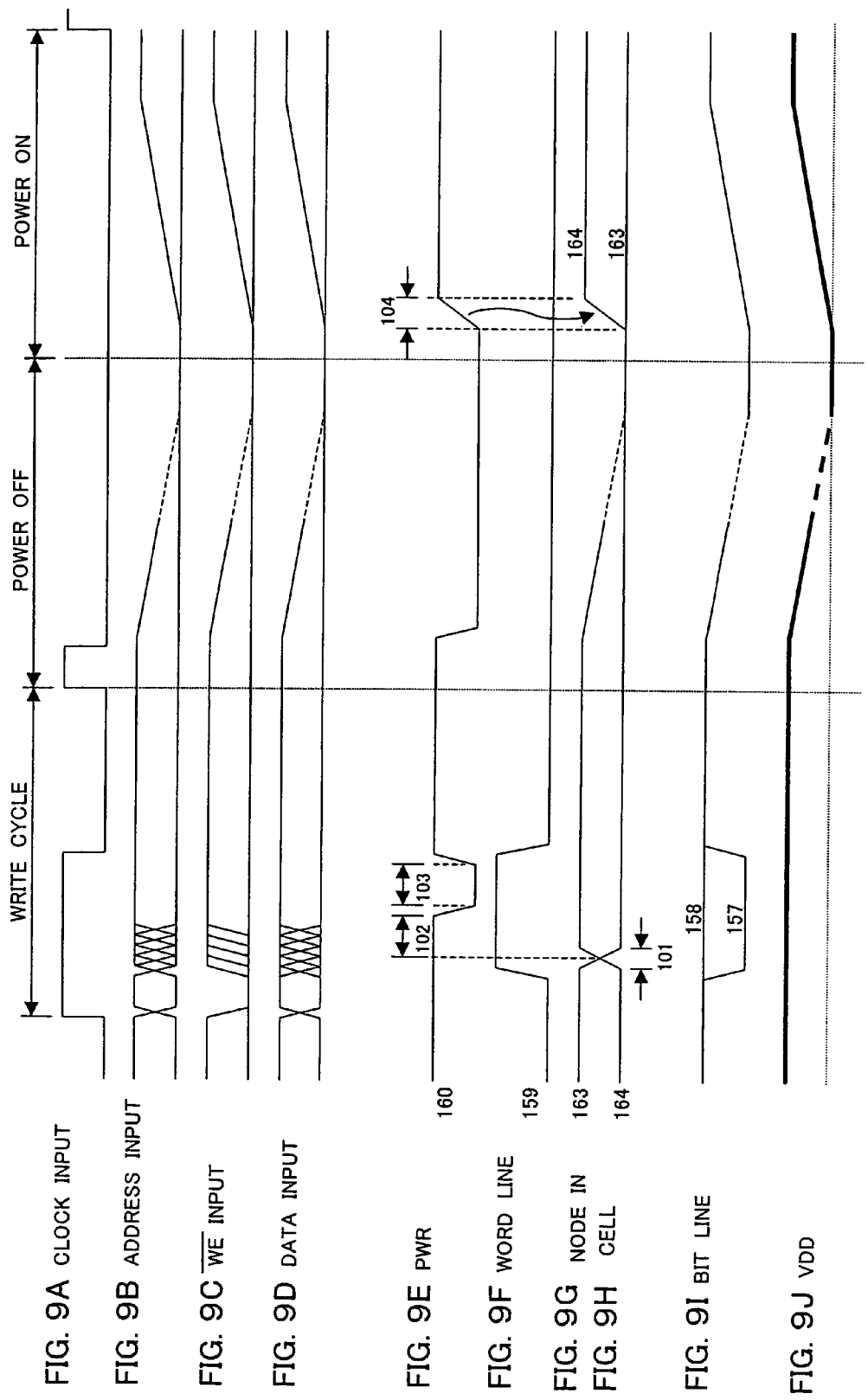
FIG. 9 is a timing chart for explaining a random write/power-on read operation of the nonvolatile memory cell of FIG. 3.

Next, consider a case of turning on the power (ON) as shown in FIG. 9. Assume that the variable resistance element 161 is in the high resistance state and the variable resistance element 162 is in the low resistance state at the stage where the power is off (OFF).

When the power supply line 160 is raised to the high potential before the other power supplies (the period of 104 shown in FIG. 9(E)), in accordance with the states of the variable resistance elements 161 and 162, the potentials of the storage nodes 163 and 164 in the cell become the "L" level and the "H" level, and this state is stably held by the positive feedback of the driver NMOS transistors 151 and 152. Thereafter, it becomes possible to perform the above write and read operations.

Next, the operation of the power-off write/power-on read operation type using the memory cell MC150 shown in FIG. 3 will be explained.

Figure 10:
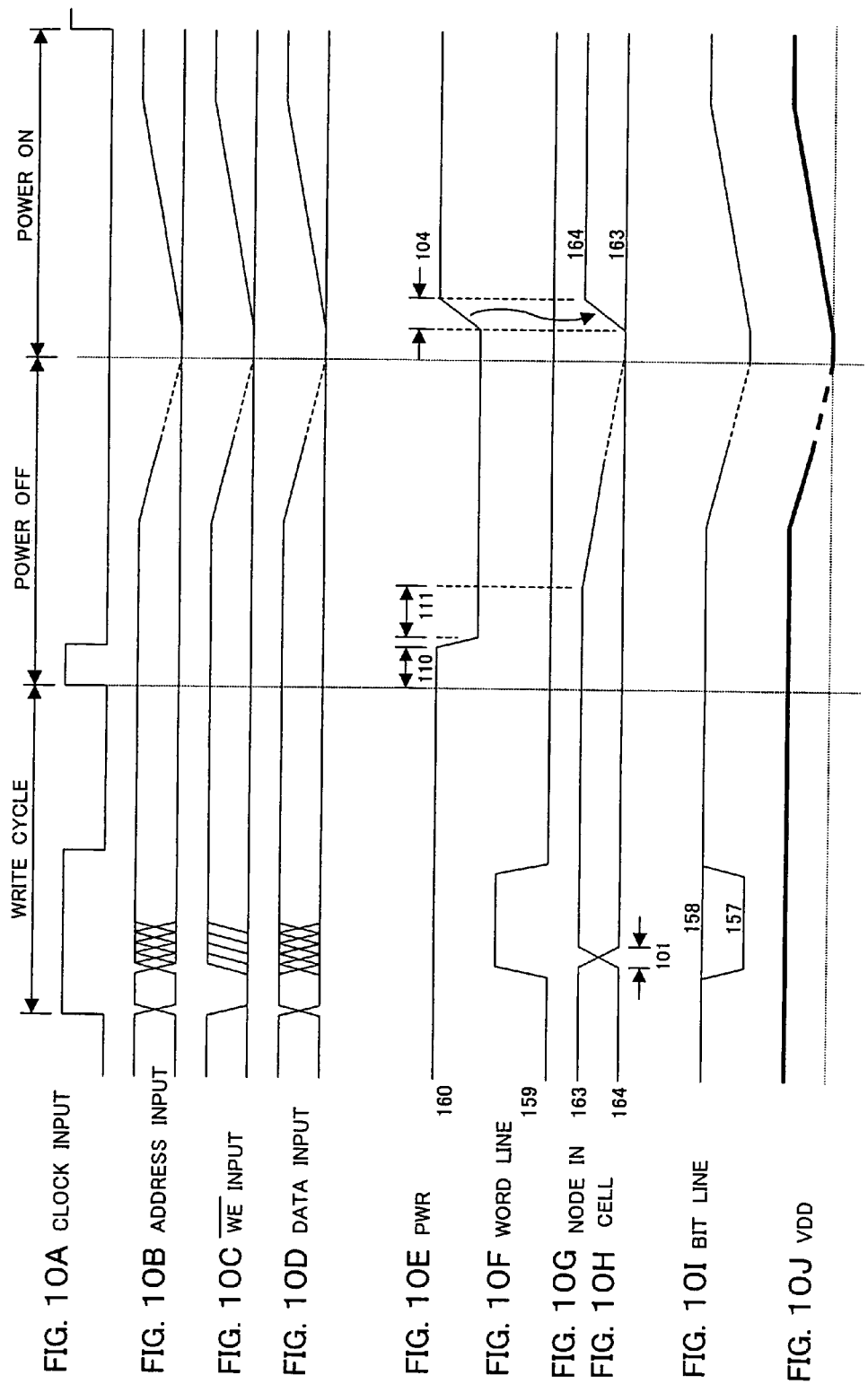
FIG. 10 is a timing chart for explaining a power-off write/power-on read operation of the nonvolatile memory cell of FIG. 3.

FIG. 10 is a timing chart of the power-off write/power-on read operation of the memory cell MC 150 of an embodiment of the present invention.

In the period when the power is on, the potential of the power supply line (160) is the "H" level and both of the variable resistance elements 161 and 162 are in the high resistance state, and therefore the memory cell MC 150 operates as a usual SRAM cell. Assume that the storage nodes 163 and 164 in the cell are at the potentials of the "L" level and the "H" level in the state immediately before the power is turned off (FIGS. 10(G) and 10(H)).

Now, a case where the data of the storage nodes 163 and 164 in the SRAM memory cell MC(1150) are written to the nonvolatile variable resistance element when the power is turned off will be explained.

The power supply line (160) potential is boosted down to the "L" level (ground level) before the power supply potential of the memory cell MC150 becomes the high level (ON), and that potential state is held in the period of 111 shown in FIG. 10(E). At this time, positive voltages of Vw or more shown in FIG. 4 are supplied to both terminals of the variable resistance element 162, and therefore the variable resistance element 162 changes from the high resistance state to the low resistance state.

Thereafter, even when the power is turned off, the resistance values of the variable resistance elements are held in their states, the variable resistance element 161 is in the high resistance state and the variable resistance element 162 is in the low resistance state because of the nonvolatility.

The read operation when the power is turned on is exactly the same as that of the random write/power-on read operation type in the above explanation.

Namely, when the power supply line 160 is raised to the high potential preceding the other power supply (the period of 104 shown in FIG. 10(E)), in accordance with states of the variable resistance elements 161 and 162, potentials of the storage nodes 163 and 164 inside the memory cell MC (150) become the "L" level and the "H" level, and this state is stably held by the positive feedback of the driver NMOS transistors 151 and 152. Thereafter, the potential of the other power supply rises, and it becomes possible to perform the normal write and read operations.

In this way, a nonvolatile storage device enabling random access and enabling a high speed operation comparable to an SRAM can be obtained.

Fourth Embodiment

Next, a nonvolatile flip-flop circuit using a nonvolatile variable resistance element will be explained with reference to FIG. 11 as a concrete circuit of a nonvolatile logic circuit 200 of another embodiment of the present invention.

The nonvolatile logic circuit 200 is configured by a volatile storage circuit 200A and an additional circuit 200B.

In the volatile storage circuit 200A, an input terminal (In) connected to the usual logic is connected to one terminal of a switch 201, and the other terminal of this switch 201 is connected to the commonly connected gates of a PMOS transistor 212 and an NMOS transistor 213 configuring the flip-flop circuit and the commonly connected drains of a PMOS transistor 210 and an NMOS transistor 211.

The commonly connected gates of the PMOS transistor 210 and the NMOS transistor 211 are connected to the commonly connected drains of the PMOS transistor 212 and the NMOS transistor 213.

The source of the PMOS transistor 210 is connected to the power supply, and the source of the NMOS transistor 211 is connected to the ground (GND).

The source of the PMOS transistor 212 is connected to the power supply, and its drain is connected to the drain of the NMOS transistor 213 and the input terminal of a switch 202. The source of the NMOS transistor 213 is connected to the ground.

Further, the output of the switch 202 is connected to an output terminal Out and connected to the usual logic circuit.

Here, the switches 201 and 202 have the CMOS transistors connected in parallel and controlled ON/OFF by the supply of the clock CLK and the inverted clock XCLK to the gates.

The additional circuit 200B is configured by switches 203 and 204 and nonvolatile variable resistance elements 215 and 216. One terminal of the switch 203 is connected to the output of the switch 201 and a drain common connecting point of the PMOS transistor 210 and the NMOS transistor 211. The other end of the switch 203 is connected to one end of the variable resistance element 215, and the other terminal of this variable resistance element 215 is connected to a power supply (PWR) line 220.

Further, one terminal of the switch 204 is connected to the input of the switch 202 and the drain common connecting point of the PMOS transistor 212 and the NMOS transistor 213. The other end of the switch 204 is connected to one terminal of the variable resistance element 216, and the other terminal of this variable resistance element 216 is connected to the power supply line 220.

Next, the operation of the nonvolatile flip-flop circuit of the nonvolatile logic circuit 200 will be explained by using FIG. 11.

As explained hitherto, in the operation of the power-off write/power-on read operation type, in both of the case of writing the data of the storage node in the SRAM cell into the nonvolatile resistance element and the case of reading the data from the nonvolatile variable resistance element to the storage node in the SRAM cell, the data are transferred between a pair of CMOS inverters and a pair of nonvolatile variable resistance elements while closing the word line as it is. Accordingly, the operation of the nonvolatile flip-flop circuit is the same as the previous explanation.

Figure 11:
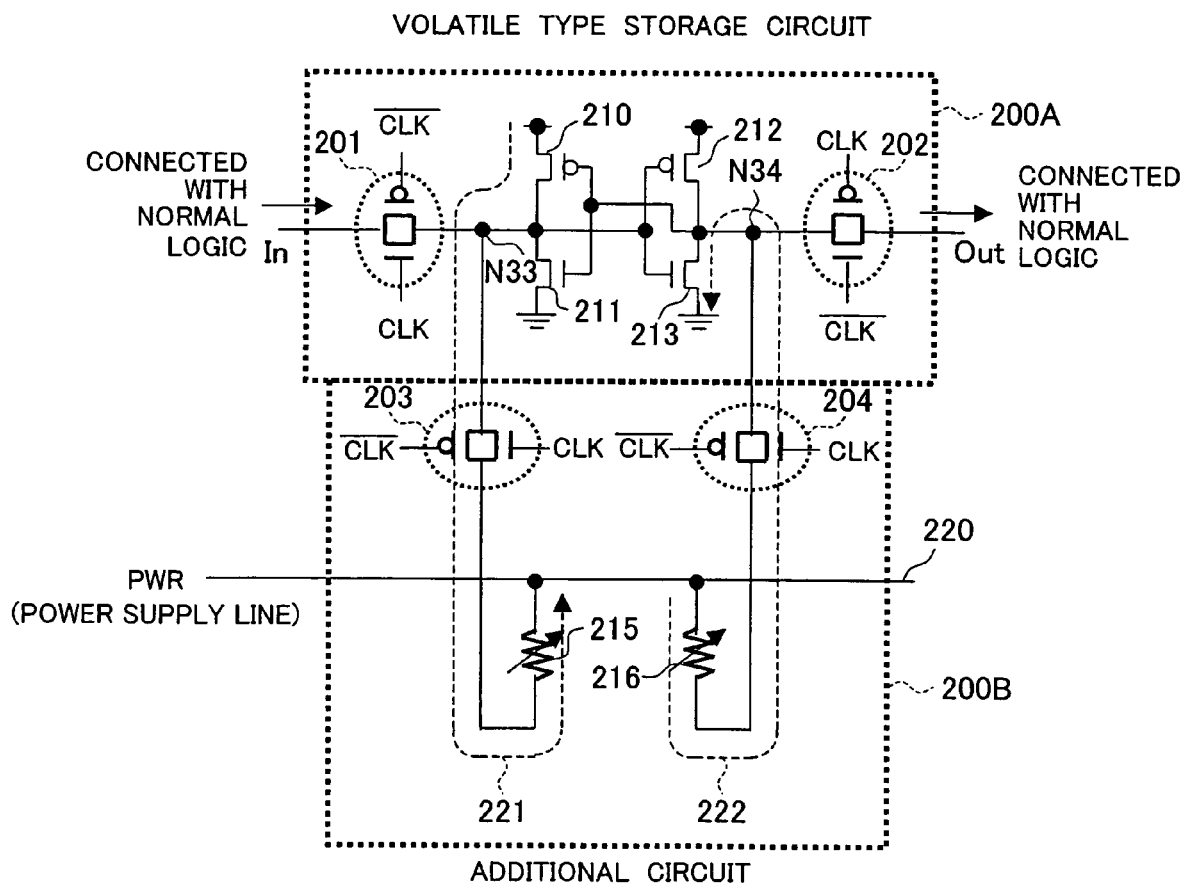
FIG. 11 is a diagram showing the configuration of a nonvolatile logic circuit.

In the nonvolatile storage circuit 200A and additional circuit 200B of the nonvolatile logic circuit 200 shown in FIG. 11, the switches 201 and 202 are switch circuits controlled by clocks for disconnecting input/output terminals, and the switches 203 and 204 are switch circuits for disconnecting the nonvolatile variable resistance elements 215 and 216 from the usual flip-flop circuit (volatile storage circuit 200A).

At the time of ordinary operation, in the volatile storage circuit 200A, the switches 201 and 202 become conductive and receive as input logic signals through input terminal (In). For example, when the input logic is the "H" level, logic signals are input to a pair of inverter circuits via the switch 201. Then, the signal of the "H" level is input to the common gate of the PMOS transistor 212 and the NMOS transistor 213, and therefore the PMOS transistor 212 becomes the OFF state, and the NMOS transistor 213 becomes the ON state. The NMOS transistor 213 is in the ON state, therefore the drain becomes the "L" level, and the voltage of this "L" level is fed back to the commonly connected gates of the PMOS transistor 210 and the NMOS transistor 211. As a result, the PMOS transistor 210 becomes the ON state, and the NMOS transistor 211 becomes the OFF state. The PMOS transistor 210 is in the ON state, so the drain becomes the "H" level. Further, the voltage of the "H" level of this drain is fed back to the commonly connected gates of the PMOS transistor 212 and the NMOS transistor 213, and as a result, the NMOS transistor 213 maintains the ON state.

When the CLK is at the "L" level and the XCLK (inverted CLK) is at the "H" level, the switch 202 becomes conductive, and the voltage of the "L" level of commonly connected drains of the PMOS transistor 212 and the NMOS transistor 213 is output from the output terminal Out.

On the other hand, when the input logic level is the "L" level, the state where the above logic level is inverted is exhibited, and the voltage of the "H" level is output from the output terminal Out to the usual logic circuit.

The volatile storage (flip-flop) circuit 200A can store data at the time of normal operation when the power is on, but it cannot store data in the period where the power is off. Therefore, by providing the additional circuit 200B in this volatile storage circuit 200A, the storage of the data is enabled even when the power is off.

When the power other than the flip-flop circuit (200A) of the nonvolatile logic circuit 200 is off, the switches 203 and 204 are brought to the ON state only at the time when the power is turned on, and the data are transferred between the flip-flop circuit (PMOS transistor 210 and NMOS transistor 211 and the PMOS transistor 212 and NMOS transistor 213) and the nonvolatile variable resistance elements 215 and 216.

First, the write operation will be explained. If a storage node N33 of the flip-flop circuit 200A is at the "H" level and a storage node N34 is at the "L" level, when the power supply line (220) potential is brought to the high potential, the variable resistance element 216 is erased and becomes a high resistance by the route of the dotted arrow 222, while when the power supply line (220) potential is brought to the low potential, the variable resistance element 215 is written in and becomes a low resistance by the route of a dotted arrow 221.

Next, the read operation will be explained. In the state where the power is off, the power supply (PWR) line 220 is raised first earlier than the other power supplies. Further, after this, the voltage of the "H" level is supplied to the gates of the switches 203 and 204 at the clock CLK and the voltage of the "L" level is supplied at the inverted clock XCLK to conduct them.

Before turning off the power, the variable resistance element 215 was at the low resistance and the variable resistance element 216 was at the high resistance, and therefore, when the potential of the power supply line 220 rises, the voltage is supplied to the storage node N33 from the power supply line 220 via the variable resistance element 215 and the switch 203. The variable resistance element 215 is the low resistance, and therefore the high voltage of the power supply line 220 is supplied to the storage node N33 whereby it becomes the "H" level.

On the other hand, the variable resistance element 216 was the high resistance, and therefore, when the power supply line 220 rises, the voltage is supplied to the storage node N34 from the power supply line 220 via the variable resistance element 216 and the switch 204. However, the voltages of the "H" level are supplied from the variable resistance element 215 of the low resistance to the gates of the PMOS transistor 212 and the NMOS transistor 213, and therefore the NMOS transistor 213 becomes the ON operation state and the drain becomes the "L" level.

The "L" level voltage of the drain of this NMOS transistor 213 is fed back to the common gate of the PMOS transistor 210 and the NMOS transistor 211, the PMOS transistor 210 becomes ON state, and the drain becomes the "H" level.

In this way, in accordance with the states of the variable resistance elements 215 and 216, the potentials of the storage nodes N33 and N34 inside the volatile storage circuit 200A become the "H" level and the "L" level, and the states of the nodes N33 and N34 are stably held by the positive feedback of the driver NMOS transistors 211 and 213. Thereafter, the other power supplies rise, and it becomes possible to perform the ordinary write and read operations.

In the normal operation period, the switches 203 and 204 are set in the OFF state, and the additional circuit 200B is disconnected from the flip-flop (volatile storage) circuit 200A and prevented from exerting an influence upon the operation of the flip-flop circuit 200A.

In FIG. 11, an example using the switches 203 and 204 for the additional circuit 200B was shown, but there is no problem in operation even when these switches are eliminated and the additional circuit is directly and constantly connected.

As explained above, by providing the additional circuit having switches and the nonvolatile variable resistance element in the usual flip-flop circuit, even when the power is turned off, the data immediately before turning off the power is stored by controlling the voltage of the power supply line supplied to the variable resistance element, and the data is read out and transferred to the flip-flop circuit when the power is turned on. For this reason, it becomes possible to store the data even when the power is turned off.

Accordingly, a nonvolatile memory cell enabling random access and enabling a high speed operation comparable to an SRAM and a storage device using the same can be obtained.

Further, it is possible to realize a flip-flop circuit having a nonvolatile function and obtain a nonvolatile logic circuit able to store the state immediately before power is turned off even when the power is turned off and continue the operation from that state after the power is turned on again.

It should be understood by those skilled in the art that various modifications, combinations, sub-combinations, and alterations may occur depending on design requirements and other factors insofar as they are within the scope of the appended claims or the equivalents thereof.

What we claim is:

1. A memory cell comprising:
   a pair of inverters including a pair of field effect transistors and a pair of nonvolatile variable resistance elements connected to drain terminals of the transistors and having cross-coupled input/output terminals; and
   a power supply line connected to other terminals of the nonvolatile variable resistance elements and supplied with a control voltage, said control voltage controlling data storage within the memory cell when power to said memory cell is turned off.

2. The memory cell as set forth in claim 1, wherein the nonvolatile variable resistance elements perform a write or erase operation by voltages of different polarities being applied to the two terminals of the variable resistance elements.

3. A memory cell comprising:
   a cross coupled pair of inverters including N-channel field effect transistors and P-channel field effect transistors serially connected, a pair of nonvolatile variable resistance elements connected to storage nodes of the cross coupled pair of inverters, and
   a power supply line connected to first terminals of the nonvolatile variable resistance elements and to which a control voltage is supplied, said control voltage controlling data storage within the memory cell when power to said memory cell is turned off.

4. The memory cell as set forth in claim 3, wherein the nonvolatile variable resistance elements perform a write or erase operation by being supplied with voltages of different polarities at their two terminals.

5. A storage device comprising:
   memory cells, each having a pair of inverters including a pair of field effect transistors and a pair of nonvolatile variable resistance element connected to drain terminals of the transistors and having cross-coupled input/output terminals and a power supply line connected to other terminals of the nonvolatile variable resistance elements and supplied with a control voltage, arranged in a matrix, a word line commonly connecting gate terminals of access transistors of the memory cells in a row direction, a pair of bit lines commonly connecting drain terminals of the access transistors in a column direction, and a control circuit supplying a control voltage to the power supply line commonly connected to first terminals of the variable resistance elements for changing characteristics of the variable resistance elements,
   wherein said control voltage controls data storage within the memory cell when power to said memory cell is turned off.

6. The storage device as set forth in claim 5, wherein the nonvolatile variable resistance elements perform a write or erase operation by being supplied with voltages of different polarities at their two terminals.

7. The storage device as set forth in claim 5, wherein the control circuit supplies the power supply line with a pulse of a first reference voltage when performing a write operation, a erase operation, or a read operation on the memory cells and sets it to a second reference voltage other than when performing a write operation on the memory cells.

8. The storage device as set forth in claim 5, wherein the control circuit performs a write or erase operation on nonvolatile variable resistance elements in the memory cells by making the word lines a high potential to conduct the access transistors conductive and, in that state, setting the power supply line at a high potential to erase information of the nonvolatile variable resistance elements in the memory cells, then, while leaving the access transistors conductive, setting the power supply line at a low potential to write in the nonvolatile variable resistance elements in the memory cells and performs a read operation on the memory cells by setting the word lines at a low potential to close the access transistors and, in that state, setting the power supply line at a high potential to transfer information from the nonvolatile variable resistance elements to memory cell storage nodes, and then setting the word lines at a high potential to conduct the access transistors and read information of the memory cells.

9. The storage device as set forth in claim 5, wherein the control circuit supplies the power supply line with a pulse of the first reference voltage when performing a write operation on the memory cells and sets it to a second reference voltage other than when performing a write operation on the memory cells.

10. The storage device as set forth in claim 9, wherein the control circuit performs a write or erase operation on nonvolatile variable resistance elements in the memory cells by setting the word lines at a high potential to conduct access transistors conductive and, in that state, setting the power supply line at a high potential to erase information of the nonvolatile variable resistance elements in the memory cells, and then, while leaving the access transistors conductive, setting the power supply line at a low potential to write in the nonvolatile variable resistance elements in the memory cells.

11. The storage device as set forth in claim 9, wherein when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

12. A storage device comprising:
   memory cells, each having a cross coupled pair of inverters including N-channel field effect transistors and P-channel field effect transistors serially connected, a pair of: nonvolatile variable resistance elements connected to storage nodes of the cross coupled pair of inverters, and a power supply line connected to first ends of the nonvolatile variable resistance, arranged in a matrix, a word line commonly connecting gate terminals of access transistors of the memory cells in a row direction, a pair of bit lines commonly connecting drain terminals of the access transistors in a column direction, and a control circuit supplying a control voltage to the power supply line commonly connected to first ends of the variable resistance elements for changing characteristics of the variable resistance elements,
   wherein said control voltage controls data storage within the memory cell when power to said memory cell is turned off.

13. The storage device as set forth in claim 12, wherein the nonvolatile variable resistance elements perform a write or erase operation by being supplied with voltages of different polarities at their two terminals.

14. The storage device as set forth in claim 12, wherein the control circuit supplies the power supply line with a pulse of a first reference voltage when performing a write operation on the memory cells and sets it to a second reference voltage other than when performing a write operation on the memory cells.

15. The storage device as set forth in claim 14, wherein the control circuit performs a write or erase operation on nonvolatile variable resistance elements in the memory cells by setting the word lines at a high potential to conduct access transistors and, in that state, setting the power supply line at a high potential to erase information of the nonvolatile variable resistance elements in the memory cells, and then, while leaving the access transistors conductive, setting the power supply line at a low potential to write in the nonvolatile variable resistance elements in the memory cells.

16. The storage device as set forth in claim 14, wherein when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

17. The storage device as set forth in claim 12, wherein while the power supplies of the memory cells are at a normal power potential immediately before the power is turned off, the control circuit changes the power supply line to a low potential so as to write information of storage nodes of the memory cells in the nonvolatile variable resistance elements.

18. The storage device as set forth in claim 17, wherein when turning on the power, in the state where access transistors of the memory cells are closed, the control circuit changes the power supply line to a high potential before the power supplies of the memory cells so as to transfer information stored in the nonvolatile variable resistance elements to storage nodes of the memory cells.

19. A nonvolatile logic circuit comprising:
a flip-flop circuit including a pair of inverters with output terminals cross coupled with each other's input terminals, and an additional circuit having a pair of nonvolatile variable resistance elements with first terminals connected to storage nodes of the flip-flop circuit and a second power supply line to which other terminals of the nonvolatile variable resistance elements are connected and provided separate from a first power supply line of the inverters to which a control voltage is supplied and driving the second power supply line by the control voltage so as to store data of the flip-flop circuit in the nonvolatile variable resistance elements when the first power supply line is turned off,
wherein said control voltage controlling data storage within the memory cell when power to said memory cell is turned off.

20. The nonvolatile logic circuit as set forth in claim 19, wherein the nonvolatile variable resistance elements perform a write or erase operation by being supplied with voltages of different polarities at their two terminals.

* * * * *